(12) United States Patent
Lee

(10) Patent No.: US 8,628,069 B2
(45) Date of Patent: Jan. 14, 2014

(54) APPARATUS FOR GUIDING AND ALIGNING SEMICONDUCTOR CHIP PACKAGE

(75) Inventor: Young-Chul Lee, Asan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 972 days.

(21) Appl. No.: 12/659,717

(22) Filed: Mar. 18, 2010

(65) Prior Publication Data

US 2010/0244346 A1 Sep. 30, 2010

(30) Foreign Application Priority Data

Mar. 26, 2009 (KR) .................. 10-2009-0026027

(51) Int. Cl.
*B23Q 1/25* (2006.01)

(52) U.S. Cl.
USPC .... 269/55; 269/289 R; 269/309; 269/254 CS; 269/900; 269/93; 269/903; 269/136; 269/138; 414/589; 414/222.01

(58) Field of Classification Search
USPC ............... 269/55, 139, 93, 71, 310, 309, 303, 269/291, 289 R, 287, 228, 227, 136, 138, 269/281, 903, 302.1, 900, 254 CS; 414/222.01, 589
See application file for complete search history.

(56) References Cited

U.S. PATENT DOCUMENTS

| 4,846,703 | A * | 7/1989 | Matsuoka et al. | 439/71 |
| 7,253,653 | B2 * | 8/2007 | Ham et al. | 324/756.02 |
| 7,642,799 | B2 * | 1/2010 | Ohkura | 324/756.02 |
| 2006/0192583 | A1 * | 8/2006 | Ham et al. | 324/765 |
| 2008/0186015 | A1 * | 8/2008 | Osakabe | 324/158.1 |
| 2008/0246464 | A1 * | 10/2008 | Saito | 324/158.1 |
| 2008/0260505 | A1 * | 10/2008 | Kang et al. | 414/281 |
| 2011/0199113 | A1 * | 8/2011 | Lee | 324/757.04 |

FOREIGN PATENT DOCUMENTS

| JP | 2001-165991 | 6/2001 |
| JP | 2004-055357 | 2/2004 |
| KR | 10-2001-0019113 | 3/2001 |
| KR | 10-2004-0049219 | 6/2004 |

* cited by examiner

*Primary Examiner* — Lee D Wilson
*Assistant Examiner* — Henry Hong
(74) *Attorney, Agent, or Firm* — Harness, Dickey & Pierce, P.L.C.

(57) ABSTRACT

Provided is an apparatus for guiding and aligning a semiconductor chip package. The apparatus may include an insert, a plate above the insert, and an adapter. The insert may be configured to house various sizes of semiconductor chip packages. The plate may be configured to move vertically with respect to the insert. The adapter may be coupled to the plate and may be configured to guide at least one semiconductor chip package into the insert and to perform alignment of the at least one semiconductor chip package. In accordance with example embodiments, the at least one semiconductor chip package may have a size corresponding to at least one of the various sizes.

15 Claims, 13 Drawing Sheets

APPARATUS FOR GUIDING AND ALIGNING SEMICONDUCTOR CHIP PACKAGE

PRIORITY STATEMENT

This application claims the benefit of priority under 35 U.S.C. §119 to Korean Patent Application No. 10-2009-0026027, filed on Mar. 26, 2009, in the Korean Intellectual Property Office (KIPO), the contents of which are hereby incorporated by reference in its entirety.

BACKGROUND

1. Field

Example embodiments relate to an apparatus for guiding and aligning a semiconductor chip package using an adapter. The adapter may perform two or more aligning processes for the adapter and a free-size insert such that a semiconductor chip package is inserted into the free-size insert and precisely aligned and the adapter and the free-size insert are aligned within a minimum contact tolerance range. More particularly, example embodiments relate to an apparatus for guiding and aligning a semiconductor chip package, in which an insert is set in a free size regardless of the size of a semiconductor chip package and an adapter is prepared for each size of the semiconductor chip package such that when the semiconductor chip package is changed, the insert is not replaced and only the adapter is replaced to house the semiconductor chip package.

2. Description of Related Art

In general, manufactured semiconductor chip packages go through reliability tests such as an electrical characteristic test and a function test before shipment. The manufactured semiconductor chip packages are transferred to test equipment. At this time, a handler is usually used as equipment for sorting the semiconductor chip packages which have been completely tested.

The handler sends a plurality of semiconductor chip packages into the test equipment, and the semiconductor chip packages are in electrical contact with a test head through a test insert pocket to perform the test process. Then, the tested semiconductor chip packages are taken out from the test head and sorted depending on the test results.

At this time, the insert corresponds one-to-one to the semiconductor chip package, and the pocket of the insert corresponds to the shape of the semiconductor chip package.

SUMMARY

In accordance with example embodiments, an apparatus for guiding and aligning a semiconductor chip package may include an insert, a plate above the insert, and an adapter coupled to the plate. The insert may be configured to house various sizes of semiconductor chip packages. The plate may be configured to move vertically with respect to the insert. The adapter may be configured to guide at least one semiconductor chip package into the insert and to perform alignment of the at least one semiconductor chip package with the insert. In accordance with example embodiments, the at least one semiconductor chip package may have a size corresponding to at least one of the various sizes.

In accordance with example embodiments, an apparatus for guiding and aligning a semiconductor chip package may include a free-size insert, a latch open plate, and an adapter. The free-size insert may be configured to house various sizes of semiconductor chip packages and may include latches configured to fix at least one semiconductor chip package having a size corresponding to one of the various sizes of semiconductor chip packages. The latch open plate may be configured to open the latches of the free-size insert. The adapter may be configured move integrally with the latch open plate and configured to guide the at least one semiconductor chip package into to the free-size insert.

Example embodiments provide an apparatus for guiding and aligning a semiconductor chip package, which can perform a test using one free-size insert, in order to solve a problem in which an insert should be prepared for each size of semiconductor chip package, as the types and functions of semiconductor chip packages are diversified.

Example embodiments also provide an apparatus for guiding and aligning a semiconductor chip package. The apparatus may include an adapter and a free size insert. The chip package may be housed in a pocket of the free size insert and the adapter may be guided into pockets of the free size insert by guide lines.

Example embodiments also provide an apparatus for guiding and aligning a semiconductor chip package, which can perform one or more aligning processes such that a semiconductor package can be housed in a pocket in a minimum contact tolerance range, in order to strengthen the reliability of a test.

Example embodiments are also directed to an apparatus for guiding and aligning a semiconductor chip package, including a free-size insert configured to house a semiconductor chip package regardless of the size of the semiconductor chip package and fix the semiconductor chip package through latches, for a reliability test The apparatus may also include a latch open plate configured to open the latches of the free-size insert and an adapter configured to guide the semiconductor chip package into the free-size insert. The adapter may be configured to move integrally with the latch open plate and simultaneously perform alignment for each size of the semiconductor chip package.

In example embodiments, the free-size insert may include four pockets provided as one set such that semiconductor chip packages can be tested in multiples of four.

In example embodiments, two latches provided as one set may be formed in a T shape on a horizontal plane to fix a pair of neighboring semiconductor chip packages at the same time. The T-shaped latches may also be configured to rotate vertically.

In example embodiments, the free-size insert may include a pocket having one size capable of housing semiconductor chip packages of various sizes, and the adapter may be designed for each size of the semiconductor chip package and vertically moved with the latch open plate. When the adapter is lowered to be received in the pocket, the semiconductor chip package may be housed in an empty space of the pocket which is not occupied by the adapter.

In example embodiments, the adapter may include a frame coupled to the latch open plate and a window on a horizontal plane such that the semiconductor chip package passes through the window. The adapter may further include a block having a guide line provided in a vertical plane. In accordance with example embodiments, the block may be inserted into the pocket to directly guide the semiconductor chip package.

In example embodiments, the block may align the adapter and the free-size insert through an outer surface corresponding to the pocket, and align the semiconductor chip package and the free-size insert through an inner surface corresponding to the semiconductor chip package, that is, the guide line.

In example embodiments, the apparatus may further include a primary alignment guide unit provided in a lower portion of the latch open plate and guiding the adapter such that the adapter is aligned with the free-size insert, the primary alignment guide unit being implemented as a post guide. In example embodiments, a post guide hole may be provided in an upper portion of the free-size insert to correspond to the post guide.

In example embodiments, the adapter may include a secondary alignment guide unit which performs the alignment of the free-size insert once more. The secondary alignment guide unit may include a stopper, a slider, a lever-type toggle, and a pin guide. The stopper may be elastically supported upward and switched downward against the elasticity when coming in contact with one side of an upper surface of the free-size insert. The slider may be lowered in a reverse direction to the movement of the stopper when the stopper is switched to rise. The lever-type toggle may have one side in contact with the stopper and another side in contact with the slider such that the slider is interlocked with the stopper and the sliding direction of the slider is reversed with respect to the sliding direction of the stopper. The pin guide may be configured to extend downward from an end of the slider to directly align the free-size insert. The free-size insert may include a pin guide hole corresponding to the pin guide.

In example embodiments, the primary alignment guide unit may permit a contact tolerance between the adapter and the free-size insert up to 20/100, and the secondary alignment guide unit may permit a contact tolerance between the adapter and the free-size insert up to 10/100.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
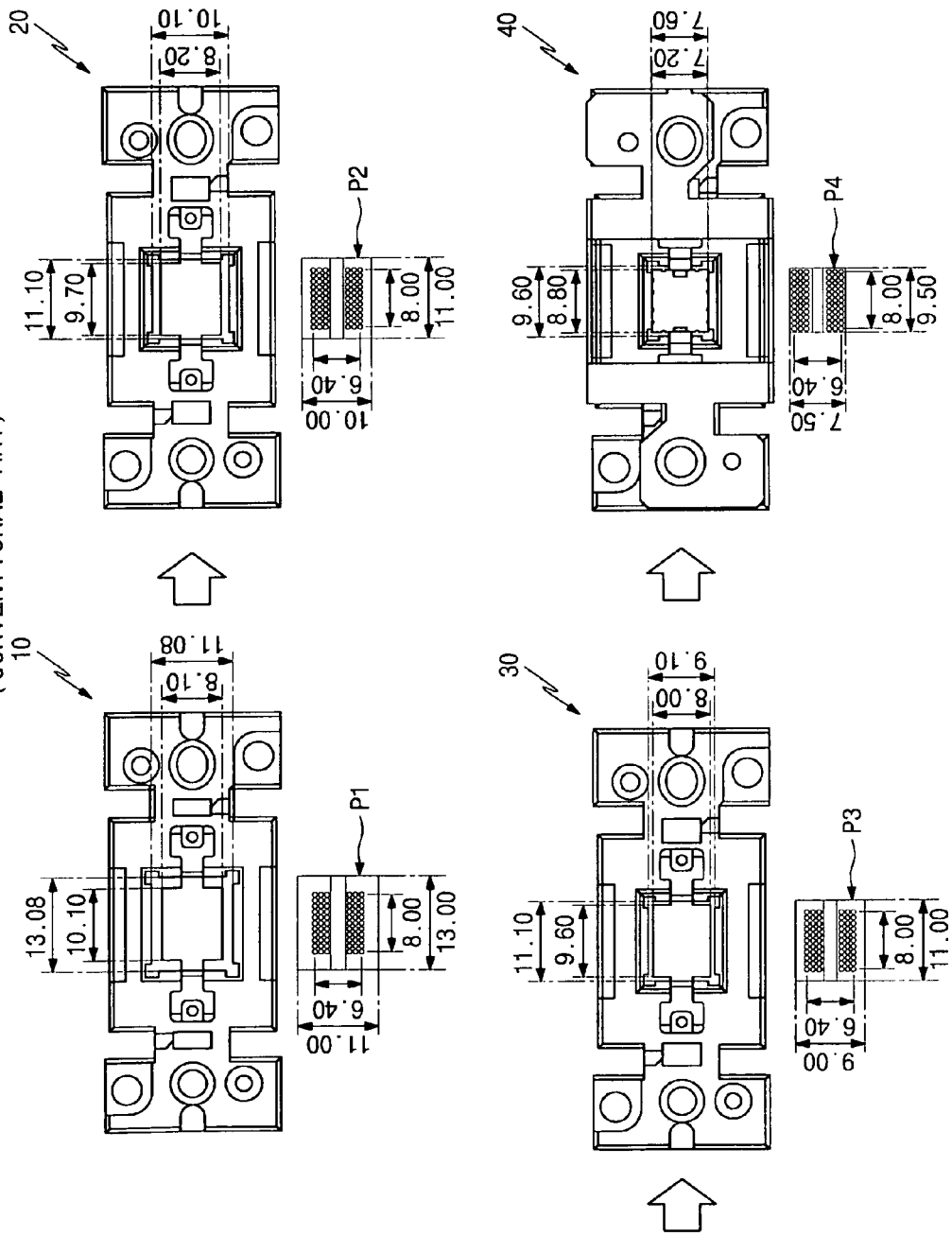
FIG. 1 is a diagram illustrating conventional inserts corresponding to semiconductor chip packages having various sizes.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

Hereinafter, an apparatus for guiding and aligning a semiconductor chip package using a moving adaptor according to example embodiments will be described with reference to the accompanying drawings.

FIG. 1 is a diagram illustrating the constructions of inserts corresponding to semiconductor chip packages having various sizes.

Semiconductor chip packages P manufactured in a semiconductor manufacturing process go through various tests, in order to check reliability of the products after the manufacturing process. For such a reliability test, semiconductor chip packages P1 to P4 are fixed in a state in which they are housed in inserts 10 to 40.

Basically, the shapes and sizes of the inserts 10 to 40 are determined to correspond to those of the semiconductor chip packages P1 to P4. Therefore, depending on the types and sizes of the semiconductor chip packages P1 to P4, the inserts 10 to 40 having different sizes from one another should be used, and should be managed separately. Accordingly, the manufacture and management of the inserts 10 to 40 may be expensive.

For example, to manufacture the inserts 10 to 40 corresponding to the sizes of the semiconductor chip packages P1 to P4, insert molds for the respective inserts 10 to 40 should be manufactured. The cost and time required to manufacture the molds may be considerably large. Further, when a product is no longer manufactured, a mold and insert corresponding to the product cannot be reused.

As such, the plurality of inserts 10 to 40 corresponding to the sizes of the respective semiconductor chip packages P1 to P4 should be provided in a width range of 7.5 to 11 mm and a length range of 9.5 to 13 mm. Since the number of kinds of inserts increases as the kinds and functions of products are diversified and complicated, measures for improving a test yield should be presented.

Figure 2:
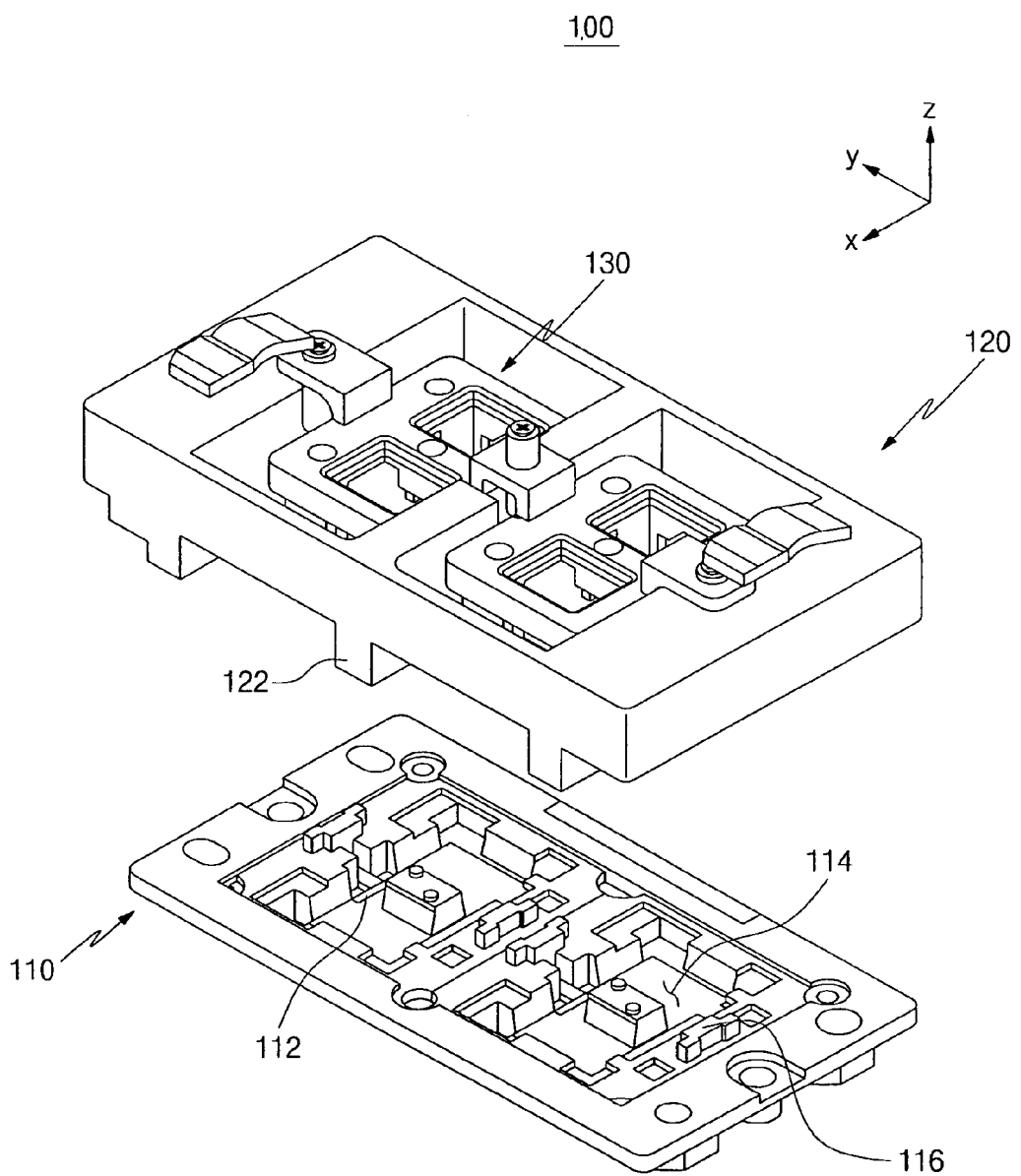
FIG. 2 is an exploded perspective view of an apparatus for guiding and aligning a semiconductor chip package using a moving adapter according to example embodiments.

FIG. 2 is a diagram of an apparatus for guiding and aligning a semiconductor chip package according to example embodiments. As shown in FIG. 2, the apparatus 100 for guiding and aligning a semiconductor chip package has an insert 110 which is implemented in such a free size as to be compatible for various sizes of a semiconductor chip packages P. The apparatus 100 actively inserts a semiconductor chip package P into the free-size insert 110 and prevents or reduces misalignment.

As shown in FIG. 2, the apparatus 100 may include the free-size insert 110 which may house a semiconductor chip package P regardless of the size of the semiconductor chip package P. The free-size insert 110 may also fix the semiconductor chip package P through latches 112 for a reliability test. The apparatus 100 may also include a latch open plate 120 which may open the latch 112 of the free-size insert 110. The apparatus 100 may also include and an adapter 130 which may guide the semiconductor chip package P to be inserted and may additionally align the semiconductor chip package P, while being integrally moved with the latch open plate 120.

A board-on-chip (BOC) package in which a board is attached on a semiconductor chip is an example of the semiconductor chip package P. However, example embodiments are not limited thereto as any package having solder balls formed on the bottom surface of boards can be used.

As shown in FIGS. 2 to 5, the free-size insert 110 includes a pocket 114 having a size such that a semiconductor chip package P having a largest size can be housed therein. For example, when products having eight kinds of sizes (width×length) of 9×11, 9×13.3, 9×9.5, 9×12, 7.5×11, 7.5×13.3, 7.5×9.5, and 7.5×12.5 are provided, the pocket 114 should have a size of 9×13.3 or more. Further, four or eight pockets 114 may be provided as one set such that one insert 110 can carry or test four or eight semiconductor chip packages P at the same time. Although example embodiments describe a free-size insert 110 as having four or eight pockets, example embodiments are not limited thereto as the free-size insert 110 may have fewer than four or more than eight pockets 114 or may have five, six, or seven pockets 114.

The free-size insert 110 includes latches 112 configured to fix a semiconductor chip package P such that the semiconductor chip package P can be fixed in a state in which it is housed in the pocket 114. The latches 112 may be formed in a T shape, and two latches may be provided as one set to fix a pair of neighboring semiconductor chip packages P at the same time.

The free-size insert 110 further includes levers 116 that may be configured to protrude from a top surface of the free-size insert 110 and to switch the latches 112 such that the latches 112 can perform hinge rotation from an open state to a lock state or from a lock state to an open state. As such, the T-shaped structure, in which the latches 112 extend in the longitudinal and widthwise directions between the neighboring pockets 114, enables the latches 112 to freely rotate without the interference of the adapter 130. Therefore, the latches 112 may fix semiconductor chip packages P, of which the sizes range from the maximum size to a minimum size, in the pockets 114.

Figure 3:
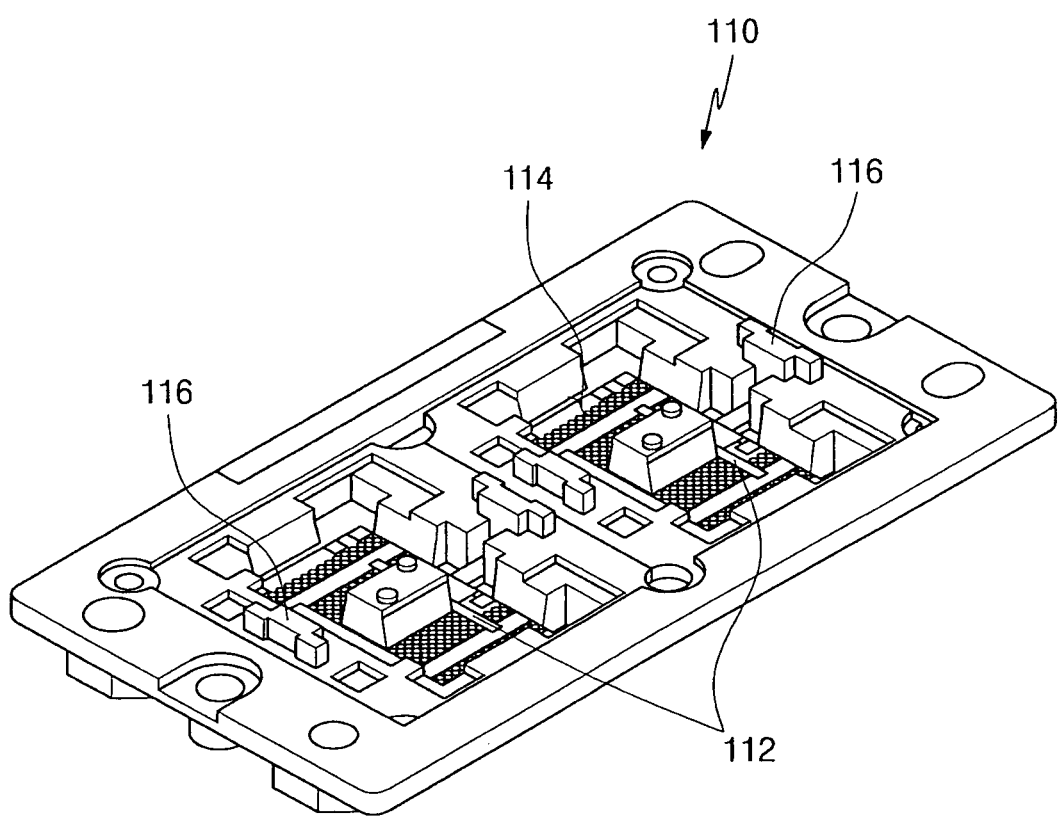
FIG. 3 is a perspective view of a free-size insert according to example embodiments.
Figure 4:
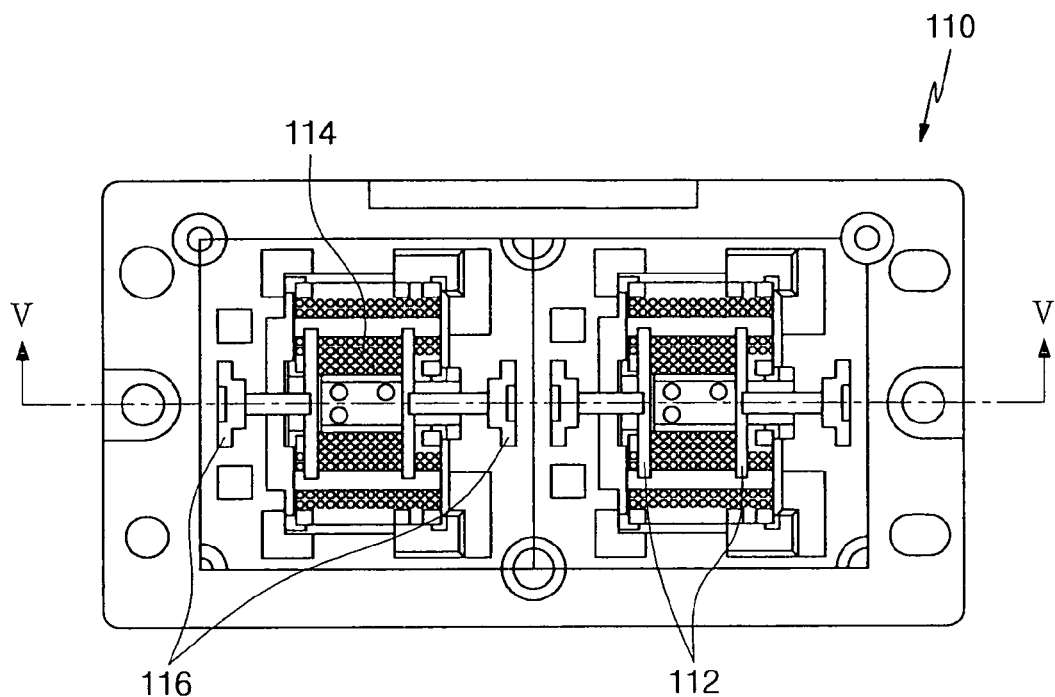
FIG. 4 is a plan view of the free-size insert according to example embodiments.
Figure 5:
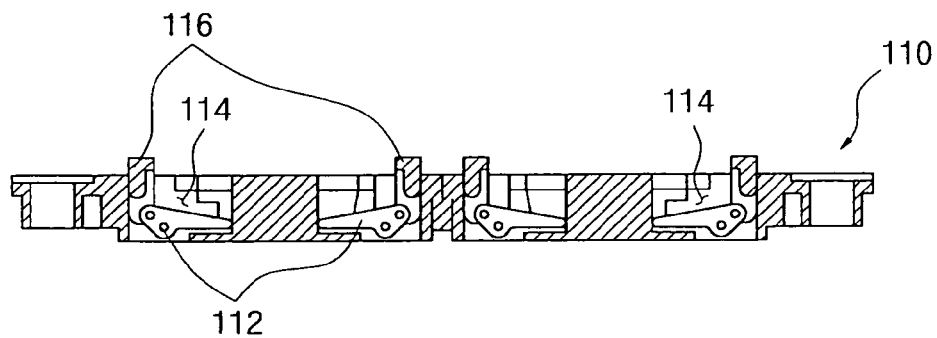
FIG. 5 is a cross-sectional view taken along line V-V of FIG. 4.

As shown in FIGS. 3 and 4, the free-size insert 110 may include a receiving surface for receiving the semiconductor chip package P. The receiving surface may be composed of a mesh structure and the mesh structure may be formed of a conductive metal.

The latch open plate 120 may be moved vertically by a driving unit (not shown). The latch open plate 120 may have a lever operation unit 122 provided on one edge thereof. The lever operation unit contacts the lever 116 when the latch open plate 120 is moved toward the free-size insert 110.

Figure 6:
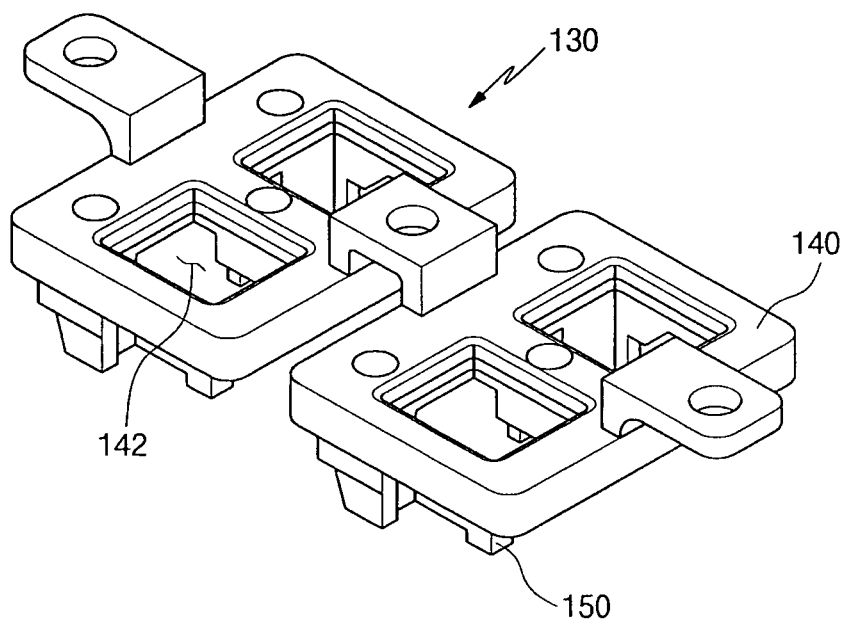
FIG. 6 is a perspective view of an adapter according to example embodiments.
Figure 7:
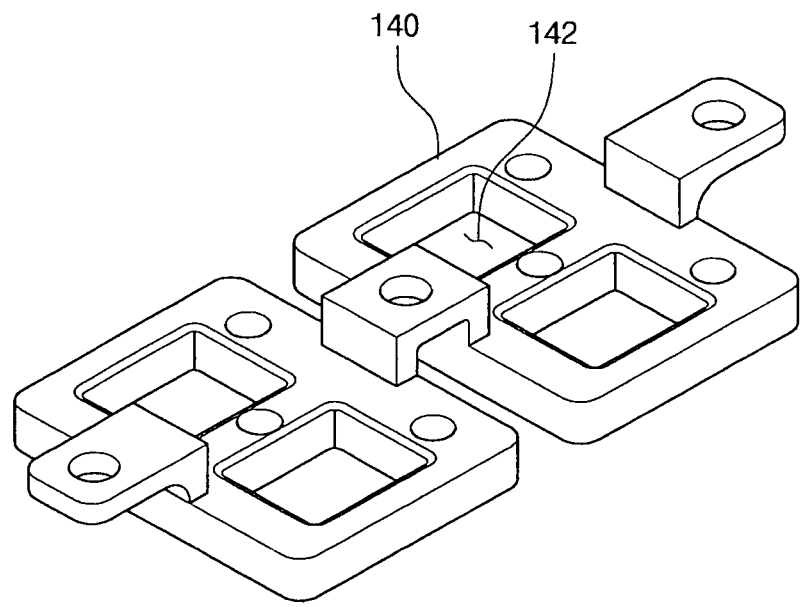
FIG. 7 is a perspective view of a frame according to example embodiments.
Figure 8:
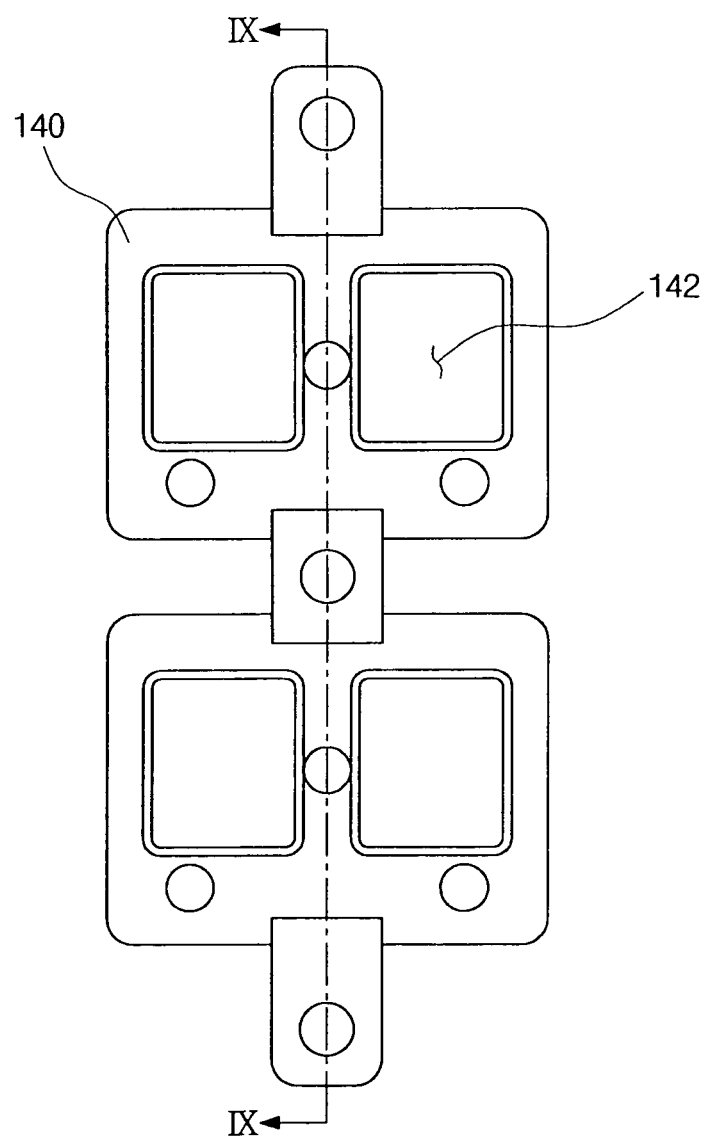
FIG. 8 is a plan view of the frame according to example embodiments.
Figure 9:
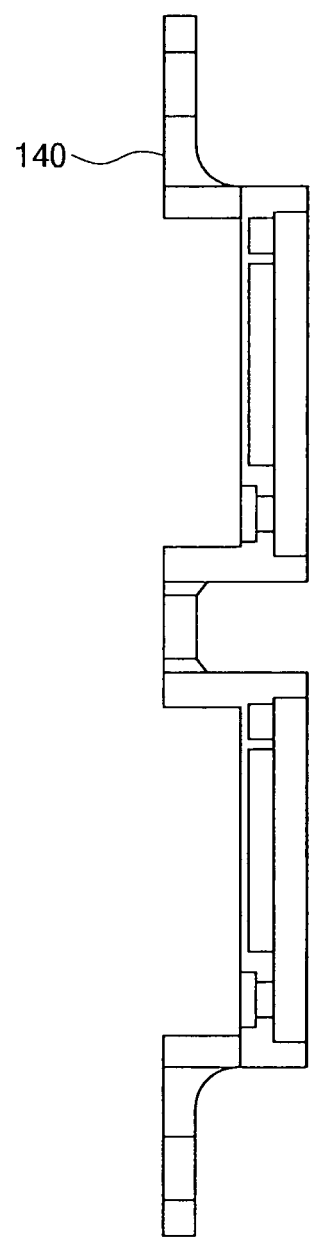
FIG. 9 is a cross-sectional view taken along line IX-IX of FIG. 8.
Figure 10:
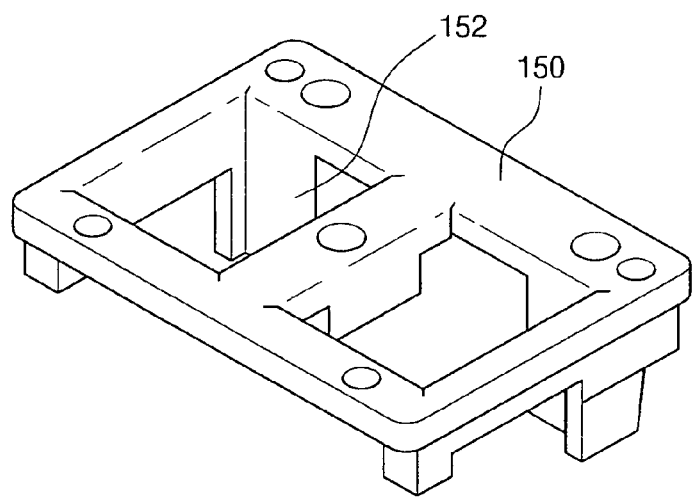
FIG. 10 is a perspective view of a block according to example embodiments.
Figure 11:
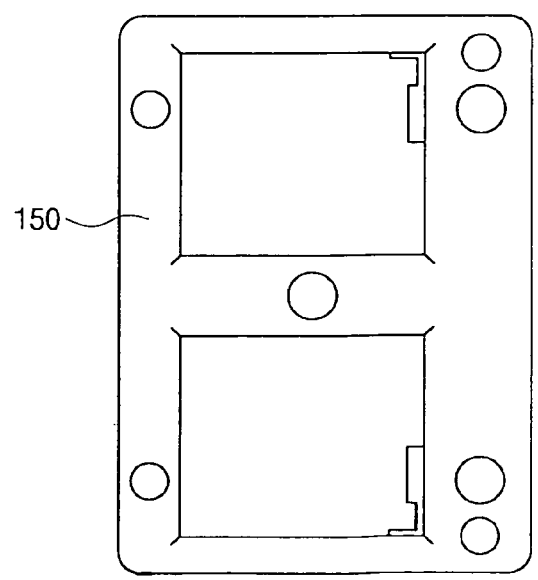
FIG. 11 is a plan view of the block according to example embodiments.
Figure 12:
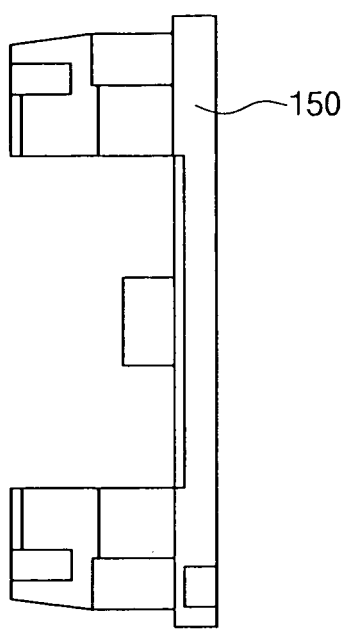
FIG. 12 is a front view of the block according to example embodiments.
Figure 13:
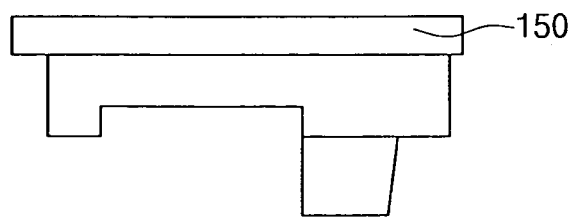
FIG. 13 is a side view of the block according to example embodiments.

As shown in FIGS. 2 and 6, the adapter 130 serves to guide a semiconductor chip package P such that the semiconductor chip package P can be housed in the pocket 114 of the free-size insert 110. Specifically, when the adapter 130 is vertically moved with the latch open plate 120 to be received on the pocket 114, the semiconductor chip package P is housed in an empty space of the pocket 114 which is not occupied by the adapter 130.

The adapter 130 may include a frame 140 which is directly coupled to the latch open plate 120 and a block 150 which is inserted into the pocket 114, as shown in FIGS. 2 and 6 to 13, to directly guide a semiconductor chip package P. The frame 140 and the block 150 may be separately manufactured for convenience of molding, but may also be integrally molded.

As shown in FIGS. 6 to 9, the frame 140 includes a plate-type window 142 provided on a horizontal plane, through which a semiconductor chip package P may pass. In accordance with the structure of the free-size insert 110 in which four pockets 114 are provided as one set, four windows 142 may also be provided as one set.

As shown in FIGS. 6 and 10 to 13, the block 150 includes a guide line 152 which may guide a semiconductor chip package P into the pocket 114 when a semiconductor chip package P is inserted into the pocket 114. Therefore, since the semiconductor chip package P may be housed in the pocket 114 while being guided by the guide line 152, the block 150 may align the adapter 130 and the free-size insert 110 through an outer surface corresponding to the pocket 114. The block 150 may have holes (not shown) corresponding to the window 142 of the frame 140. In this case, two holes may be provided as one set.

The block 150 may be standardized for various sizes of semiconductor chip packages P. As the block 150 is designed for various sizes of semiconductor chip packages P, one side of a semiconductor chip package P may be supported by the inside of the pocket 114, and another side thereof may be supported by the inside of the block 150. Therefore, when a semiconductor chip package P has a large size, a proportion occupied by the block 150 in the pocket 114 should be relatively small. Further, when a semiconductor chip package P has a small size, a proportion occupied by the block 150 in the pocket 114 should be relatively large. That is, a thickness of the block 150 may differ.

Because the outer surface of the block 150 may be in contact with the inner surface of the pocket 114, the block 150 may perform a function of aligning the adapter 130 and the free-size insert 110. Further, as described above, the guide line 152 formed on the inner surface of the block 150 may perform a function of guiding a semiconductor chip P into the pocket 114.

Figure 14:
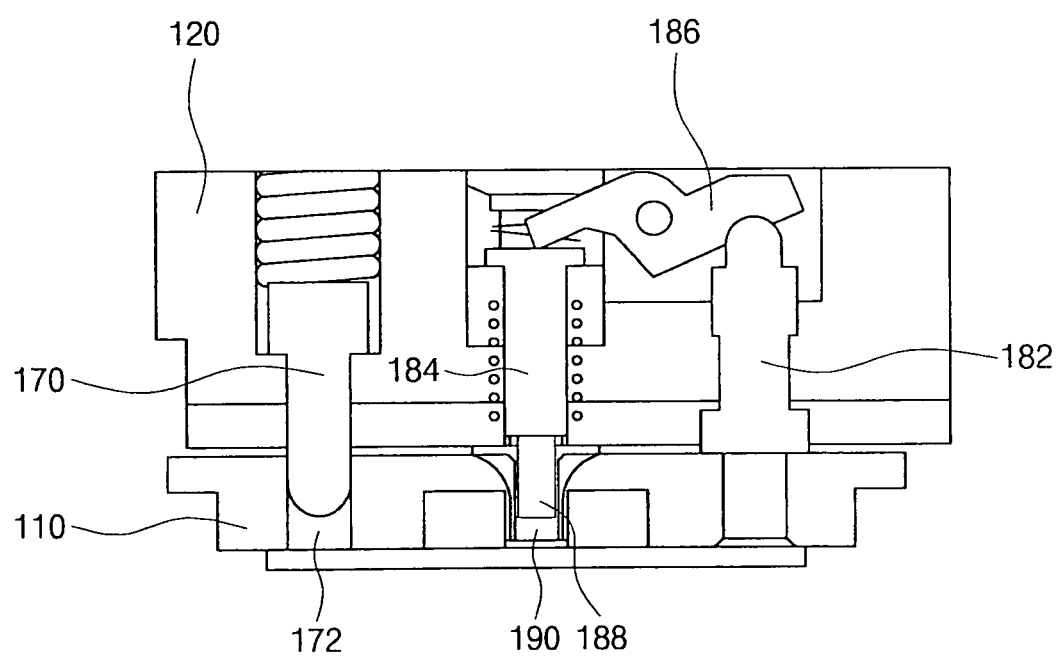
FIG. 14 is a cross-sectional view of primary and secondary alignment guide units according to example embodiments.

As shown in FIG. 14, the latch open plate 120 has a primary alignment guide unit provided on the other edge thereof. The primary alignment guide unit primarily aligns the latch open plate 120 and the free-size insert 110. The primary alignment guide unit may be implemented as a post guide 170. The free-size insert 110 has a post guide hole 172 corresponding to the post guide 170. The latch open plate 120 may be moved in such a state that it is integrally coupled to the adapter 130, and thus may perform a function of aligning the adapter 130 and the free-size insert 110. As such, the post guide 170 may serve to minimize a contact tolerance between the adapter 130 and the free-size insert 110. In example embodiments, the contact tolerance may be permitted up to about 20/100.

As described above, the adapter 130 may perform a function of guiding the insertion of a semiconductor chip package P. Further, the adapter 130 may also perform a function of aligning the semiconductor chip package P for each size. However, since the primary alignment guide unit permits a contact tolerance in the range of 20/100, the primary alignment guide unit may not prevent misalignment. Therefore, in order to effectively perform a reliability test, the alignment function may need to be strengthened. Accordingly, the latch open plate 120 may include a secondary alignment guide unit which secondarily aligns the adapter 130 and the free-size insert 110.

FIG. 14 is a cross-sectional view obtained by cutting one edge of the apparatus for guiding and aligning a semiconductor chip package in the X-axis direction in FIG. 2, showing the construction of the primary and secondary alignment guide units. As shown in FIG. 14, the primary alignment guide unit is provided in one side, and the secondary alignment guide unit is provided in the other side.

The secondary alignment guide unit may include a stopper 182, a slider 184, a toggle 186, and a pin guide 188. The stopper 182 is elastically supported toward the lower side, i.e., the free-size insert 110. When an end of the stopper 182 comes in contact with one side of the upper surface of the free-size insert 110, the stopper 182 is moved upward against the elasticity. When the stopper 182 ascends, the slider 184 descends in the reverse direction to the movement of the stopper 182. The lever-type toggle 186 has one side in contact with the stopper 182 and the other side in contact with the slider 184 such that the slider 184 is interlocked with the stopper 182 and the sliding direction thereof is reversed. The pin guide 188 extends from an end of the slider 184 toward the free-size insert 110 and slides with the slider 184 to directly align the free-size insert 110.

FIG. 14 illustrates a case in which the slider 184 is elastically supported upward by an elastic member. As described above, however, the slider 184 may be elastically supported by the stopper 182. Further, the toggle 186 may be hinge-connected to the stopper 182 and/or the slider 184.

The free-size insert 110 has a pin guide hole 190 corresponding to the pin guide 188. The secondary alignment guide unit can reduce the contact tolerance to a range of 10/100 through the pin guide 188 and the pin guide hole 190. Therefore, the alignment can be performed more delicately.

The post guide 170 and the post guide hole 172 primarily align the adapter 130 and the free-size insert 110 within a large contact tolerance range, and the pin guide 188 and the pin guide hole 190 secondarily align the adapter 130 and the free-size insert 110 within a small contact tolerance range. Therefore, misalignment may be reduced or prevented.

As such, when the free-size insert 110 is molded in one type and size regardless of the type or size of the semiconductor chip package P and the adapter 130 is prepared for each size of the semiconductor chip package P, only the adapter 130 need be replaced, if necessary. Further, the adapter 130 may be mounted on the latch open plate 120 and integrally moved. Therefore, when the adapter 130 is prepared for each size of the semiconductor chip package P, the adapter 130 may be immediately replaced every time the semiconductor chip package P is changed. In the case of the free-size insert 110, a large quantity of free-size inserts 110 should be provided in proportion to the quantity of semiconductor chip packages, in order to carry and test the semiconductor chip packages in a reliability test. Therefore, when the free-size insert 110 is prepared in one type and size, it is possible to reduce or minimize the costs.

Hereinafter, an operation process in which a semiconductor chip package is guided into the free-size insert and aligned by the moving adapter will be described with reference to FIGS. 15 to 17.

Figure 15:
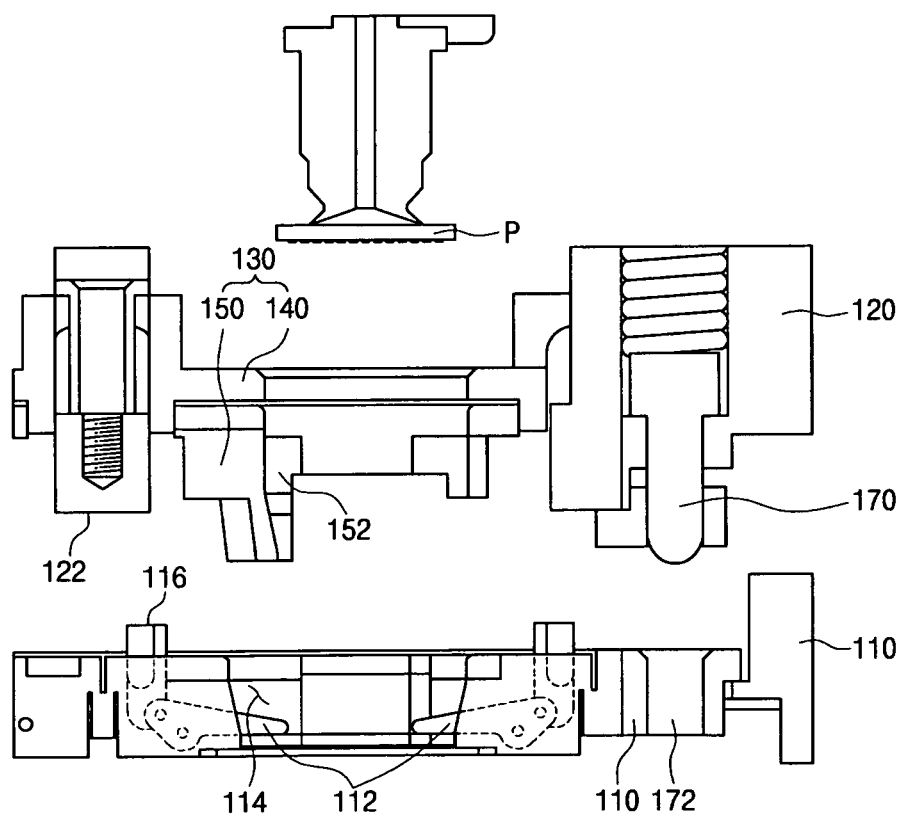
FIGS. 15 to 17 are diagrams showing a process of guiding and aligning a semiconductor chip package according to example embodiments.

As shown in FIG. 15, when the type of a semiconductor chip package P to be tested is determined, an adapter 130 corresponding to the size of the semiconductor chip package P is selected and coupled to the latch open plate 120. The adapter 130 is positioned above the free-size insert 110 installed in a test tray (no reference numeral), and the latch open plate 120 is lowered. As the lever operation unit 122 of the latch open plate 120 comes in contact with the lever 116 of the free-size insert 110, the lever operation unit pressurizes the lever 116 to perform switching. At this time, the latches 112 are opened from a horizontal state to a vertical state in the pocket 114, to provide a condition wherein the semiconductor chip package P can be received in the pocket 114.

Figure 16:
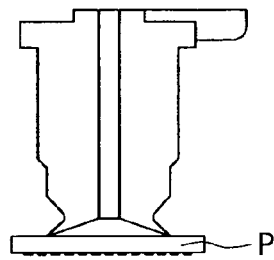
Figure 16:
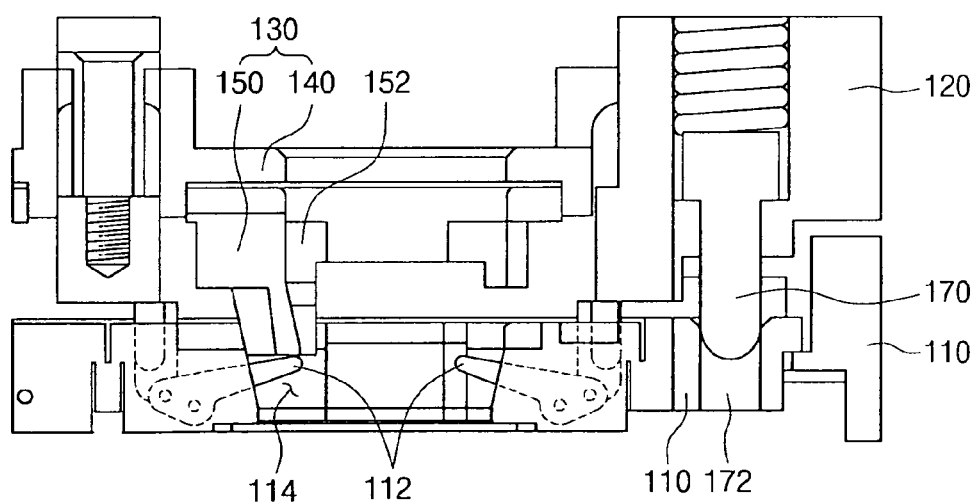

As shown in FIG. 16, as the latch open plate 120 is continuously lowered, the adapter 130 and the free-size insert 110 are primarily aligned by the primary alignment guide unit. When the post guide 170 is inserted into the post guide hole 172 to vertically slide while being guided, the block 150 of the adapter 130 is inserted into the pocket 114 of the free-size insert 110 within an error range of the contact tolerance (20/100). Because the post guide hole 172 has an end tapered in a round shape, the post guide 170 easily enters the post guide hole 172. When the entrance is performed to some extent, the adapter 130 is automatically aligned in the pocket 114, while being moved in the four directions by the post guide 170 and the post guide hole 172.

Figure 17:
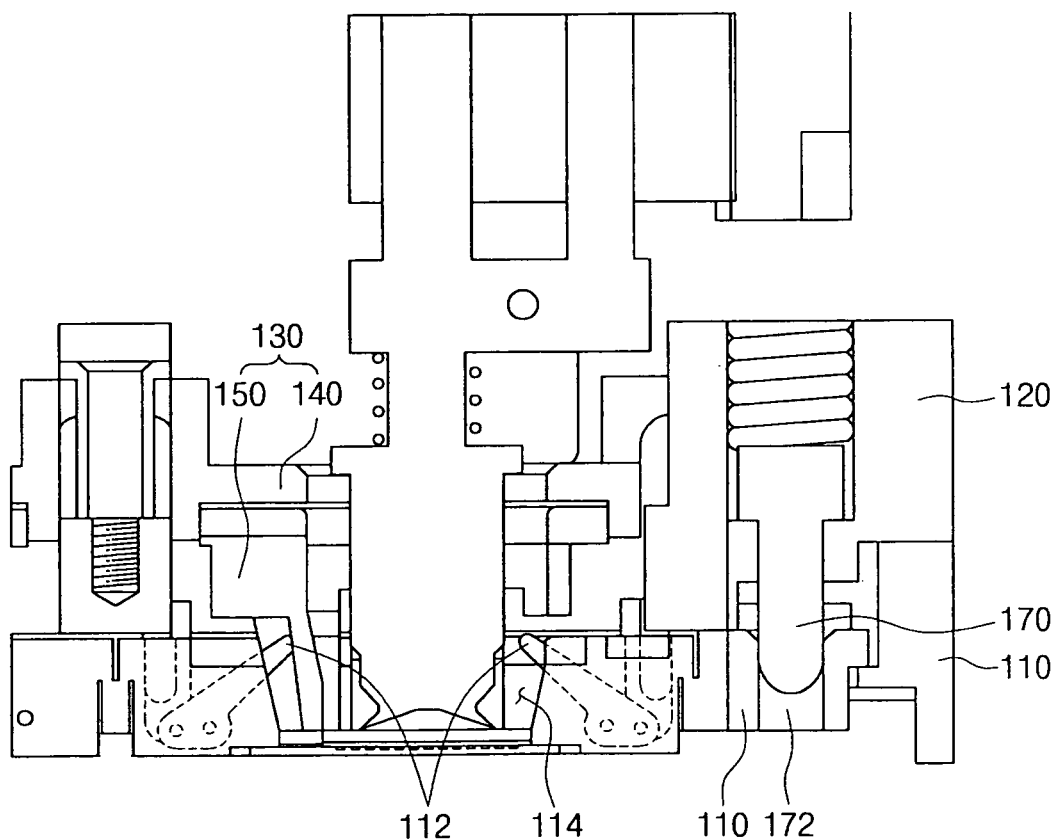

As shown in FIG. 17, when the latch open plate 120 is further lowered, the adapter 130 and the free-size insert 110 are secondarily aligned by the secondary alignment guide unit. As soon as the adapter 130 and the free-size insert 110 are aligned by the primary alignment guide unit through the insertion of the post guide 170 into the post guide hole 172, the pin guide 188 is inserted into the pin guide hole 190.

Referring to FIG. 14, a process in which the pin guide 188 is inserted into the pin guide hole 190 will be described as follows. While the latch open plate 120 is lowered, the stopper 182, which has been elastically supported downward by an elastic member, comes in contact with the upper surface of the free-size insert 110 to be pressurized upward. Because the stopper 182 is in contact with the toggle 186, one end of the toggle 186 is also pressurized upward, the toggle 186 contacts the slider 184 and moves the slider 184 downward through the principle of the lever, because the center of the toggle 186 is rotatably fixed to one side of the latch open plate 120.

Therefore, the pin guide 188 provided at the end of the slider 184 attempts entrance into the pin guide hole 190, while moving downward. Then, while the pin guide 188 slides in the pin guide hole 190 within an error range of the contact tolerance (10/100), the adapter 130 is automatically aligned in the four directions, and the block 150 of the adapter 130 can be accurately received in the pocket 114 of the free-size insert 110.

When the insertion and alignment of the adapter 130 are completed, a picker (no reference numeral) that has picked up the semiconductor chip package P is lowered. The semiconductor chip package P passes through the window 142 to be received in the pocket 114, while being guided by the block 150. That is, while being guided by the guide line 152 formed by the block 150, the semiconductor chip package P is inserted into the pocket 114.

When the reception of the semiconductor chip package P is completed and the latch open plate 120 is lifted, the contact between the lever operation unit of the latch open plate 120 and the lever 116 of the free-size insert 110 is released, and the latches 112 are locked from the vertical state to the horizontal state. Accordingly, the semiconductor chip package P is fixed in a state in which it is aligned in the pocket 114. Then, a test for the semiconductor chip package P is performed by test equipment.

As described above, when an insert housing a semiconductor chip package is manufactured and managed for each size of the semiconductor chip package for a reliability test, the cost increases, and the yield decreases. In example embodiments, however, the free-size insert capable of housing a semiconductor chip package regardless of the size of the semiconductor chip package is provided, and the adapter for guiding the semiconductor chip package into the free-size insert is provided for each size. The adapter guides the semiconductor chip package through the block such that the semiconductor chip package can be housed in the pocket, and is simultaneously aligned by the primary alignment guide unit such that the contact tolerance between the post guide and the post guide hole can be reduced to a range of 20/100. Further, the adapter is aligned by the secondary alignment guide unit such that the contact tolerance between the post guide and the post guide hole can be reduced to a range of 10/100.

According to example embodiments, it is possible to expect the following effects. First, since an insert does not need to be prepared for each size of a semiconductor chip package, a cost for separately manufacturing and managing the insert can be reduced. Second, when a plurality of inserts are used for the sizes of semiconductor chip packages, the inserts should be replaced every time a product is changed. However, when an adapter is prepared for each size, only the adapter may be replaced, if necessary. Therefore, a yield significantly increases, and lost time is reduced. Third, since four pockets are provided as one set in the insert and the latches are provided as a set such that a pair of semiconductor chip packages can be fixed at the same time, a large quantity of semiconductor chip packages can be tested. Fourth, the adapter performs a function of guiding a semiconductor chip package into a pocket of the free-size insert, and simultaneously performs a function of aligning the semiconductor chip package for each size in the four directions though the block. Fifth, the adapter and the insert are aligned by the primary alignment guide unit within a large contact tolerance range, and then aligned by the secondary alignment guide unit within a small contact tolerance range. Therefore, the semiconductor chip package is not misaligned in the pocket of the insert, and the reliability of the test increases.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An apparatus for guiding and aligning a semiconductor chip package, comprising:
   an insert configured to house various sizes of semiconductor chip packages;
   a plate configured to move vertically with respect to the insert; and
   an adapter coupled to the plate, the adapter configured to guide at least one semiconductor chip package into the insert and to perform alignment of the at least one semiconductor chip package with the insert, the at least one semiconductor chip package having a size corresponding to at least one of the various sizes, wherein
   the insert includes at least one pocket having one size capable of housing the various sizes of semiconductor chip packages, and
   the adapter is configured to insert into the pocket so that when the adapter is in the pocket, the at least one semiconductor chip package is housed in an empty space of the pocket not occupied by the adapter, the adapter including
      a frame coupled to the plate, the frame having at least one window on a horizontal plane configured to accommodate the at least one semiconductor chip package, and
      at least one block having a guide line provided on a vertical plane, the at least one block configured to insert into the at least one pocket to directly guide the at least one semiconductor chip package into the insert.

2. The apparatus according to claim 1, wherein the insert includes
   at least one latch configured to fix the various sizes of semiconductor chip packages against a receiving surface of the insert, and
   at least one lever configured to move the at least one latch, and
   the plate includes a lever operation unit configured to press the at least one lever to move the at least one latch.

3. The apparatus according to claim 1, wherein the at least one pocket includes at least four pockets, the at least one window includes at least four windows, and the at least one semiconductor chip package includes at least four semiconductor chip packages so that the at least four semiconductor chip packages can be tested in at least multiples of four.

4. The apparatus according to claim 3, wherein
   at least two of the windows of the at least four windows are provided as neighboring windows to accommodate two neighboring semiconductor chip packages of the at least four semiconductor chip packages, and
   the insert includes two latches provided as one set, each of the two latches formed in a T shape on a horizontal plane to simultaneously fix a pair of neighboring semiconductor chip packages, and configured to vertically rotate.

5. The apparatus according to claim 4, wherein the one set of latches are pinned between vertical surfaces of the insert.

6. The apparatus according to claim 4, wherein the insert includes at least one lever protruding through an upper surface of the insert, the lever being configured to rotate the two latches vertically.

7. The apparatus according to claim 6, wherein the plate includes a lever operation unit configured to engage and move the at least one lever.

8. The apparatus according to claim 1, wherein the at least one block includes an outer surface corresponding to an inner surface of the at least one pocket, and the at least one block aligns the adapter and the insert via the outer surface and the inner surface, and the at least one block aligns the at least one semiconductor chip package and the insert via an inner surface of the at least one block corresponding to the semiconductor chip package.

9. An apparatus for guiding and aligning a semiconductor chip package, comprising:
   an insert configured to house various sizes of semiconductor chip packages;
   a plate configured to move vertically with respect to the insert; and
   an adapter coupled to the plate, the adapter configured to guide at least one semiconductor chip package into the insert and to perform alignment of the at least one semiconductor chip package with the insert, the at least one semiconductor chip package having a size corresponding to at least one of the various sizes, wherein
   the plate includes a primary alignment guide unit in a lower portion of thereof and a second alignment guide unit configured to align the insert, the primary alignment guide unit configured to guide the adapter and align the adapter with the insert, the primary alignment guide unit including a post guide, the secondary alignment guide unit including
      an elastically supported stopper configured to move upward when the stopper contacts an upper surface of the insert,
      a slider configured to move downward when the stopper moves upward, and
      a lever-type toggle having one side in contact with the stopper and another side in contact with the slider such that the slider is interlocked with the stopper and the moving direction of the slider is reversed to the moving direction of the stopper, and a pin guide configured to extend downward from an end of the slider to directly align the insert, and
   the insert includes a post guide hole in an upper portion thereof corresponding to the post guide and a pin guide hole corresponding to the pin guide.

10. The apparatus according to claim 9, wherein the primary alignment guide unit permits a contact tolerance between the adapter and the insert up to 20/100, and
   the secondary alignment guide unit permits a contact tolerance between the adapter and the insert up to 10/100.

11. An apparatus for guiding and aligning a semiconductor chip package, comprising:
   a free-size insert configured to house various sizes of semiconductor chip packages, the free size insert including latches configured to fix at least one semiconductor chip package having a size corresponding to one of the various sizes of semiconductor chip packages;
   a latch open plate configured to open the latches of the free-size insert; and
   an adapter configured to move integrally with the latch open plate and configured to guide the at least one semiconductor chip package into to the free-size insert, wherein
   the free-size insert includes at least one pocket having one size capable of housing the various sizes of semiconductor chip packages, and
   the adapter is configured to insert into the pocket so that when the adapter is in the pocket, the at least one semiconductor chip package being housed in an empty space of the pocket not occupied by the adapter,
   wherein the adapter includes a frame coupled to the latch open plate, the frame having at least one window on a horizontal plane configured to accommodate the at least one semiconductor chip package, and at least one block having a guide line provided on a vertical plane, the at least one block being configured to insert into the at least one pocket to directly guide the at least one semiconductor chip package into the free-size insert.

12. The apparatus according to claim 11, wherein
the free-size insert includes levers attached to the latches and configured to move the latches, and
the latch open plate includes a lever operation unit configured to press the latches of the free-size insert.

13. The apparatus according to claim 11, wherein the at least one pocket includes at least four pockets, the at least one window includes at least four windows, and the at least one semiconductor chip package includes at least four semiconductor chip packages so that the at least four semiconductor chip packages can be tested in at least multiples of four.

14. The apparatus according to claim 13, wherein
at least two of the windows of the at least four windows are provided as neighboring windows to accommodate two neighboring semiconductor chip packages of the at least four semiconductor chip packages, and
the free-size insert includes two latches provided as one set, the each of the two latches formed in a T shape on a horizontal plane to simultaneously fix a pair of neighboring semiconductor chip packages, and configured to vertically rotate.

15. The apparatus according to claim 14, wherein the one set of latches are pinned between vertical surfaces of the free-size insert.

* * * * *